US010432214B2

(12) United States Patent
Weng et al.

(10) Patent No.: US 10,432,214 B2
(45) Date of Patent: Oct. 1, 2019

(54) APPARATUS FOR APPLYING DIFFERENT TRANSFER FUNCTIONS TO CODE SEGMENTS OF MULTI-BIT OUTPUT CODE THAT ARE SEQUENTIALLY DETERMINED AND OUTPUT BY MULTI-BIT QUANTIZER AND ASSOCIATED DELTA-SIGMA MODULATOR

(71) Applicant: MEDIATEK INC., Hsin-Chu (TW)

(72) Inventors: Chan-Hsiang Weng, Hsinchu (TW); Tien-Yu Lo, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/190,168

(22) Filed: Nov. 14, 2018

(65) Prior Publication Data

US 2019/0199368 A1 Jun. 27, 2019

Related U.S. Application Data

(60) Provisional application No. 62/610,586, filed on Dec. 27, 2017.

(51) Int. Cl.
*H03M 3/00* (2006.01)
*H03M 1/12* (2006.01)
(Continued)

(52) U.S. Cl.
CPC .......... *H03M 3/424* (2013.01); *H03M 3/454* (2013.01); *H03M 3/456* (2013.01); *H03M 3/464* (2013.01);
(Continued)

(58) Field of Classification Search
CPC ............ H03M 3/30; H03M 1/12; H03M 1/06; H03M 1/10
(Continued)

(56) References Cited

U.S. PATENT DOCUMENTS 5,682,161 A  10/1997 Ribner
6,229,466 B1  5/2001 Gattani
(Continued)

FOREIGN PATENT DOCUMENTS

JP   4065227        3/2008
TW   201114195 A1   4/2011
TW   201517521 A    5/2015

OTHER PUBLICATIONS

Lin He et al., A Multibit Delta-Sigma Modulator With Double Noise-Shaped Segmentation, IEEE Transactions on Circuits and Systems-II: Express Briefs, vol. 62, No. 3, Mar. 2015, pp. 241-245, XP011574096.
(Continued)

*Primary Examiner* — Joseph J Lauture
(74) *Attorney, Agent, or Firm* — Winston Hsu

(57) ABSTRACT

A signal processing apparatus has a multi-bit quantizer and a processing circuit. The multi-bit quantizer determines and outputs code segments of a multi-bit output code sequentially. The code segments include a first code segment and a second code segment. The processing circuit generates digital outputs according to the code segments, respectively. The digital outputs include a first digital output derived from a first code segment and a second digital output derived from a second code segment. A first transfer function between the first digital output and the first code segment is different from a second transfer function between the second digital output and the second code segment.

20 Claims, 6 Drawing Sheets

(51) Int. Cl.
*H03M 1/10* (2006.01)
*H03M 1/06* (2006.01)

(52) U.S. Cl.
CPC ............... *H03M 1/06* (2013.01); *H03M 1/10* (2013.01); *H03M 1/12* (2013.01); *H03M 3/30* (2013.01)

(58) Field of Classification Search
USPC .................. 341/143, 155, 118, 120; 375/247
See application file for complete search history.

(56) References Cited

U.S. PATENT DOCUMENTS

| | | | |
|---|---|---|---|
| 6,304,608 B1 | 10/2001 | Chen | |
| 8,169,351 B2 * | 5/2012 | Lee | H03M 3/356 341/143 |
| 9,455,737 B1 | 9/2016 | Rajaee | |

OTHER PUBLICATIONS

Saska Lindfors et al., Two-Step Quantization in Multibit ΔΣ Modulators, IEEE Transactions on Circuits and Systems-II: Analog and Digital Signal Processing, vol. 48, No. 2 Feb. 2001, pp. 171-176, XP55588807.

Saska Lindfors et al., Two-Step Quantization Architectures for Multibit ΔΣ Modulators, ISCAS 2000—IEEE International Symposium on Circuits and Systems, May 28-31, 2000, Geneva, Switzerland, pp. II-25-II-28, XP010502651.

Mohammad Ranjbar et al., A 3.1 mW Continuous-Time ΔΣ Modulator With 5-Bit Successive Approximation Quantizer for WCDMA, IEEE Journal of Solid-State Circuits, vol. 45, No. 8, Aug. 2010, pp. 1479-1491, XP011314250.

* cited by examiner

APPARATUS FOR APPLYING DIFFERENT TRANSFER FUNCTIONS TO CODE SEGMENTS OF MULTI-BIT OUTPUT CODE THAT ARE SEQUENTIALLY DETERMINED AND OUTPUT BY MULTI-BIT QUANTIZER AND ASSOCIATED DELTA-SIGMA MODULATOR

CROSS REFERENCE TO RELATED APPLICATIONS

This application claims the benefit of U.S. provisional application No. 62/610,586, filed on Dec. 12, 2017 and incorporated herein by reference.

BACKGROUND

The present invention relates to analog-to-digital conversion, and more particularly, to an apparatus for applying different transfer functions to code segments of a multi-bit output code that are sequentially determined and output by a multi-bit quantizer and an associated delta-sigma modulator.

In a typical delta-sigma modulator, the bit number of the internal quantizer is usually the same as that of the feedback digital-to-analog converter (DAC) input. While the bit number of the internal quantizer grows, completing a voltage-to-digital conversion would consume more latency. In a typical multi-bit quantizer operating in a sequential manner, the most significant bits (MSBs) would be ready first and the least significant bits (LSBs) would be completed with longer latency. Since the LSB information would prolong the loop latency of the delta-signal modulator, implementing a high-speed excess loop delay (ELD) compensation loop path is stringent in a delta-sigma modulator using a multi-bit feedback DAC.

SUMMARY

One of the objectives of the claimed invention is to provide an apparatus for applying different transfer functions to code segments of a multi-bit output code that are sequentially determined and output by a multi-bit quantizer and an associated delta-sigma modulator.

According to a first aspect of the present invention, an exemplary signal processing apparatus is disclosed. The exemplary signal processing apparatus includes a multi-bit quantizer and a processing circuit. The multi-bit quantizer is arranged to quantize an analog input to generate a multi-bit output code. The processing circuit is arranged to receive the code segments from the multi-bit quantizer, and is further arranged to generate a plurality of digital outputs according to the code segments.

According to a second aspect of the present invention, an exemplary delta-sigma modulator is disclosed. The exemplary delta-sigma modulator includes a feed-forward circuit and a feedback circuit. The feed-forward circuit includes an integrator circuit and a multi-bit quantizer. The feedback circuit includes a processing circuit, a digital-to-analog conversion circuit, and a combining circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . .". Also, the term "couple" is intended to mean either an indirect or direct electrical connection. Accordingly, if one device is coupled to another device, that connection may be through a direct electrical connection, or through an indirect electrical connection via other devices and connections.

Figure 1:
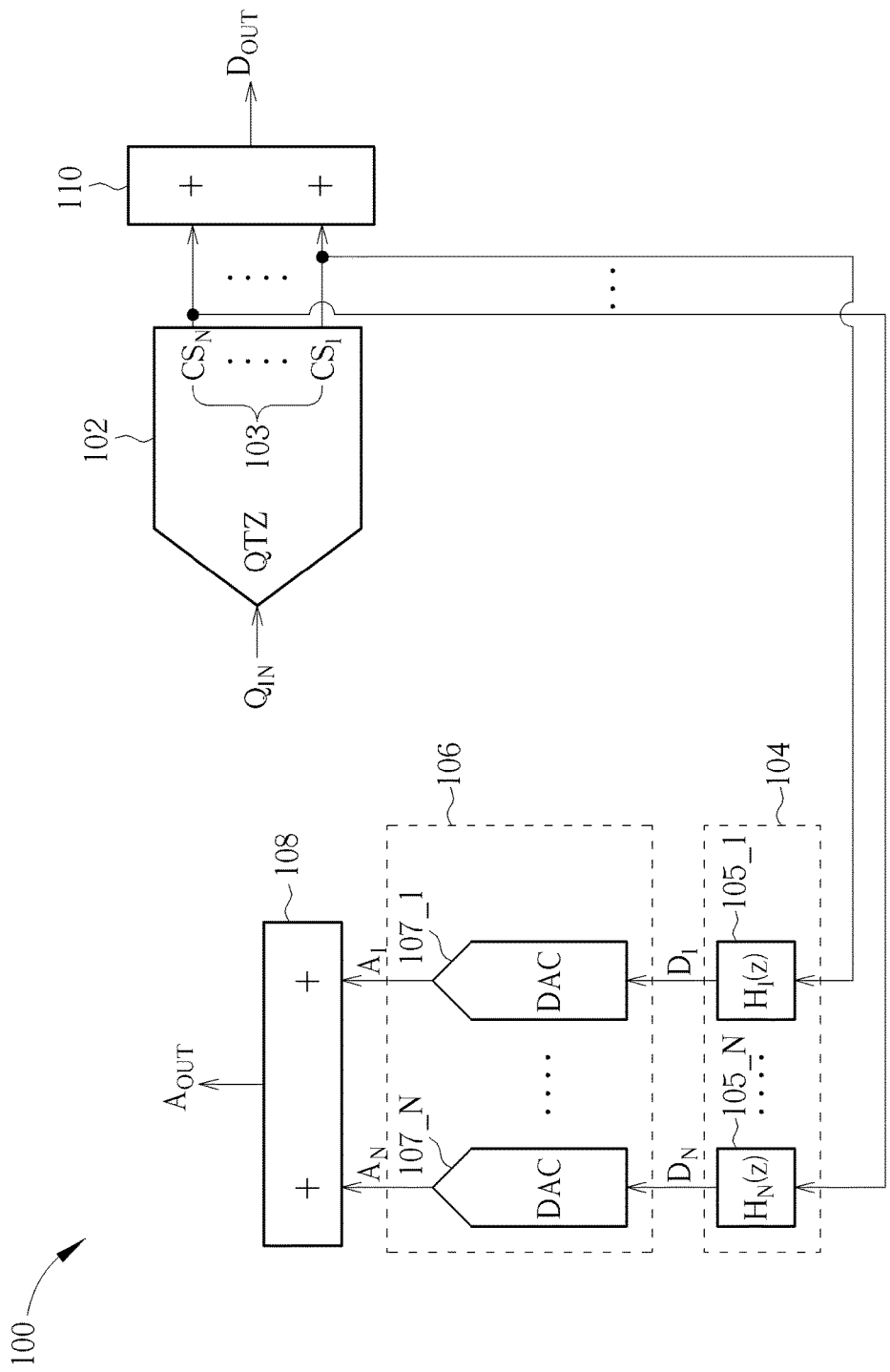
FIG. 1 is a diagram illustrating a first signal processing apparatus according to an embodiment of the present invention.

FIG. 1 is a diagram illustrating a first signal processing apparatus according to an embodiment of the present invention. The signal processing apparatus 100 may be employed by a variety of applications, including a delta-sigma modulator, an audio playback system, etc. As shown in FIG. 1, the signal processing apparatus 100 includes a multi-bit quantizer (denoted by "QTZ") 102, a processing circuit 104, a digital-to-analog conversion circuit 106, and a plurality of combining circuits 108 and 110. The multi-bit quantizer 102 is arranged to quantize an analog input $Q_{IN}$ (e.g., a voltage level) to generate a multi-bit output code 103 (e.g., a digital code representative of the voltage level). The multi-bit output code 103 consists of a plurality of code segments $CS_1$-$CS_N$, where each of the code segments $CS_1$-$CS_N$ may include one or more bits. For one example, the number of the code segments $CS_1$-$CS_N$ is equal to 2 (i.e., N=2), the code segment $CS_1$ consists of LSBs of the multi-bit output code 103, and the code segment $CS_2$ consists of MSBs of the multi-bit output code 103. For another example, the number of the code segments $CS_1$-$CS_N$ is equal to 3 (i.e., N=3), the code segment $CS_1$ consists of lower-order bits of LSBs of the multi-bit output code 103, the code segment $CS_2$ consists of higher-order bits of LSBs of the multi-bit output code 103, and the code segment $CS_3$ consists of MSBs of the multi-bit output code 103. To put it simply, the present invention has no limitations on the partitioning of the multi-bit output code 103.

In this embodiment, when quantizing the analog input $Q_{IN}$ that may be sampled in a current sampling clock period, the multi-bit quantizer 102 determines and outputs the code segments $CS_1$-$CS_N$ for the analog input $Q_{IN}$ in a sequential manner. More specifically, the multi-bit quantizer 102 resolves the code segments $CS_1$-$CS_N$ one by one, and resolves bits in the same code segment one by one. For example, the multi-bit quantizer 102 is a successive approximation register (SAR) based quantizer. In a case where N=2, the multi-bit quantizer 102 completes determination of the code segment $CS_2$ (which consists of MSBs of the multi-bit output code 103) before completing determination of the code segment $CS_1$ (which consists of LSBs of the multi-bit output code 103). In a case where N=3, the multi-bit quantizer 102 completes determination of the code segment $CS_3$ (which consists of MSBs of the multi-bit output code 103) before completing determination of the code segment $CS_2$ (which consists of higher-order bits of LSBs of the multi-bit output code 103), and completes determination of the code segment $CS_2$ (which consists of higher-order bits of LSBs of the multi-bit output code 103) before completing determination of the code segment $CS_1$ (which consists of lower-order bits of LSBs of the multi-bit output code 103). Since the multi-bit quantizer (e.g., SAR-based quantizer) 102 determines and outputs the code segments $CS_1$-$CS_N$ in the sequential manner, the combining circuit 110 is arranged to combine the code segments $CS_1$-$CS_N$ sequentially provided from the preceding multi-bit quantizer 102, and outputs a digital output $D_{OUT}$ that contains the complete multi-bit output code 103 (i.e., $CS_N$, . . . , $CS_1$) to a following processing circuit (not shown).

The processing circuit 104 is arranged to receive the code segments $CS_1$-$CS_N$ from the multi-bit quantizer 102, and is further arranged to generate a plurality of digital outputs $D_1$-$D_N$ according to the code segments $CS_1$-$CS_N$, respectively. In this embodiment, the processing circuit 104 generates the digital outputs $D_1$-$D_N$ by applying different transfer functions $H_1(z)$-$H_N(z)$ to the code segments $CS_1$-$CS_N$ at digital signal processing circuits 105_1-105_N. As shown in FIG. 1, one digital output $D_1$ is derived from the code segment $CS_1$, and another digital output $D_N$ is derived from the code segment $CS_N$, wherein the processing circuit 104 receives the code segment $CS_N$ from the multi-bit quantizer 102 before receiving the code segment $CS_1$ from the multi-bit quantizer 102, and the transfer function $H_1(z)$ between the digital output $D_1$ and the associated code segment CS1 is different from the transfer function $H_N(z)$ between the digital output $D_N$ and the associated code segment $CS_N$.

The digital-to-analog conversion circuit 106 includes a plurality of digital-to-analog converters (DACs) 107_1-107_N arranged to receive the digital outputs $D_1$-$D_N$ from the processing circuit 104 and convert the digital outputs $D_1$-$D_N$ into analog outputs $A_1$-$A_N$, respectively. The combining circuit 108 is arranged to generate and output an analog output $A_{OUT}$ by combining the analog outputs $A_1$-$A_N$ of the DACs 107_1-107_N.

As mentioned above, digital signal processing circuits 105_1-105_N are arranged to have transfer functions $H_1(z)$-$H_N(z)$, respectively. One digital signal processing circuit may be a memory system (whose output signal at any time depends on past value(s) of its input signal) or a memoryless system (whose output signal at any time depends on the present value of its input signal), depending upon the actual design considerations.

Figure 2:
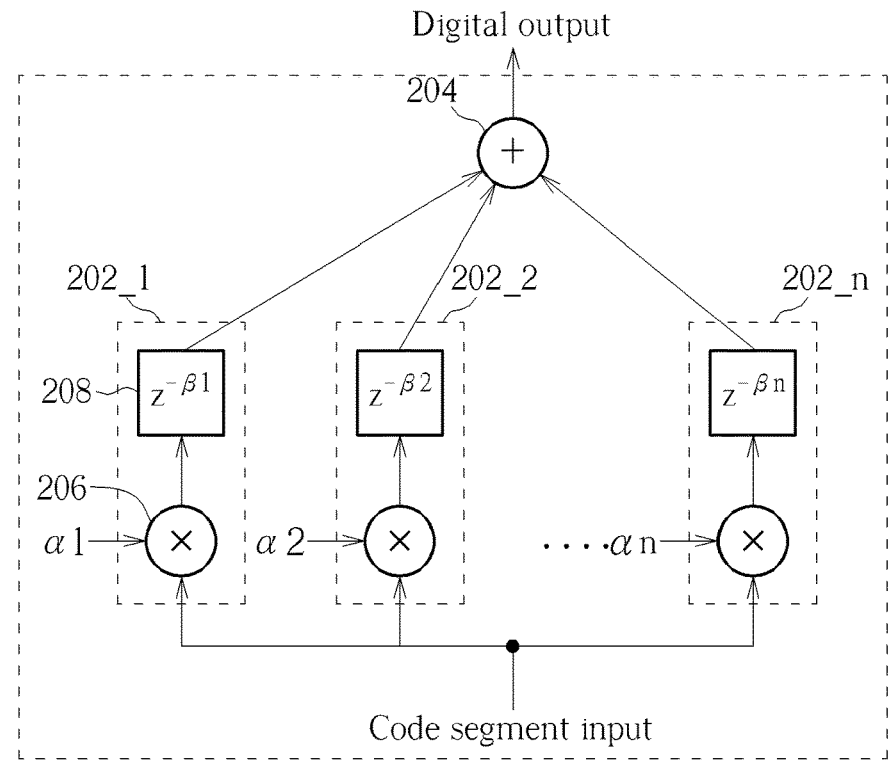
FIG. 2 is a diagram illustrating one digital signal processing circuit for generating a digital output according to a code segment input according to an embodiment of the present invention.

FIG. 2 is a diagram illustrating one digital signal processing circuit for generating a digital output according to a code segment input according to an embodiment of the present invention. One or more of the digital signal processing circuits 105_1-105_N shown in FIG. 1 maybe implemented using the digital signal processing circuit 200 shown in FIG. 2. The digital signal processing circuit 200 is a memory system (whose output signal at any time depends on past value(s) of its input signal), and includes a plurality of delay-based circuits 202_1, 202_2, . . . , 202_n and a combining circuit 204. The same code segment input (e.g., one of the code segments $CS_1$-$CS_N$ shown in FIG. 1) is fed into each of the delay-based circuits 202_1-202_n. Each of the delay-based circuits 202_1-202_n includes a multiplier circuit 206 and a delay circuit 208, where the multiplier circuit 206 is arranged to apply a weighting factor to the code segment input, and the delay circuit 208 is arranged to apply a delay amount to the code segment input. The weighting factor may be selected from a group {α1, α2, . . . , αn}. The delay amount may be selected from a group {β1, β2, . . . , βn}. The transfer function H(z) between the digital output and the code segment input can be expressed using the following formula.

$$H(z) = \alpha 1 \cdot z^{-\beta 1} + \alpha 2 \cdot z^{-\beta 2} + \ldots + \alpha n \cdot z^{-\beta n} \quad (1)$$

It should be noted that a weighting factor αi (1≤i≤n) in the group {α1, α2, . . . , αn} could be a positive value, a negative value, or a zero value, depending upon the actual design consideration; and a delay amount βi (1≤i≤n) in the group {β1, β2, . . . , βn} could be a fractional value or an integer value, depending upon the actual design consideration. A person skilled in the pertinent art should readily appreciate that the digital signal processing circuit 200 can be properly modified to have any desired transfer function H(z) .

Figure 3:
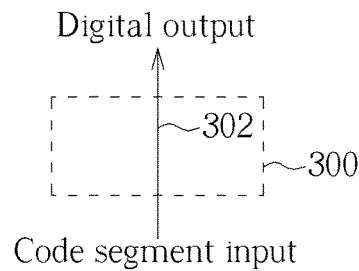
FIG. 3 is a diagram illustrating another digital signal processing circuit for generating a digital output according to a code segment input according to an embodiment of the present invention.

FIG. 3 is a diagram illustrating another digital signal processing circuit for generating a digital output according to a code segment input according to an embodiment of the present invention. One or more of the digital signal processing circuits 105_1-105_N shown in FIG. 1 maybe implemented using the digital signal processing circuit 300 shown in FIG. 3. In this embodiment, the digital signal processing circuit 300 is a memoryless system (whose output signal at any time depends on the present value of its input signal), and is implemented using a direct path 302 that is arranged to transmit the code segment input (e.g., one of the code segments $CS_1$-$CS_N$ shown in FIG. 1) as the digital output directly. Hence, the transfer function H(z) between the code segment input and the digital output is a constant (e.g., H(z)=1).

Figure 4:
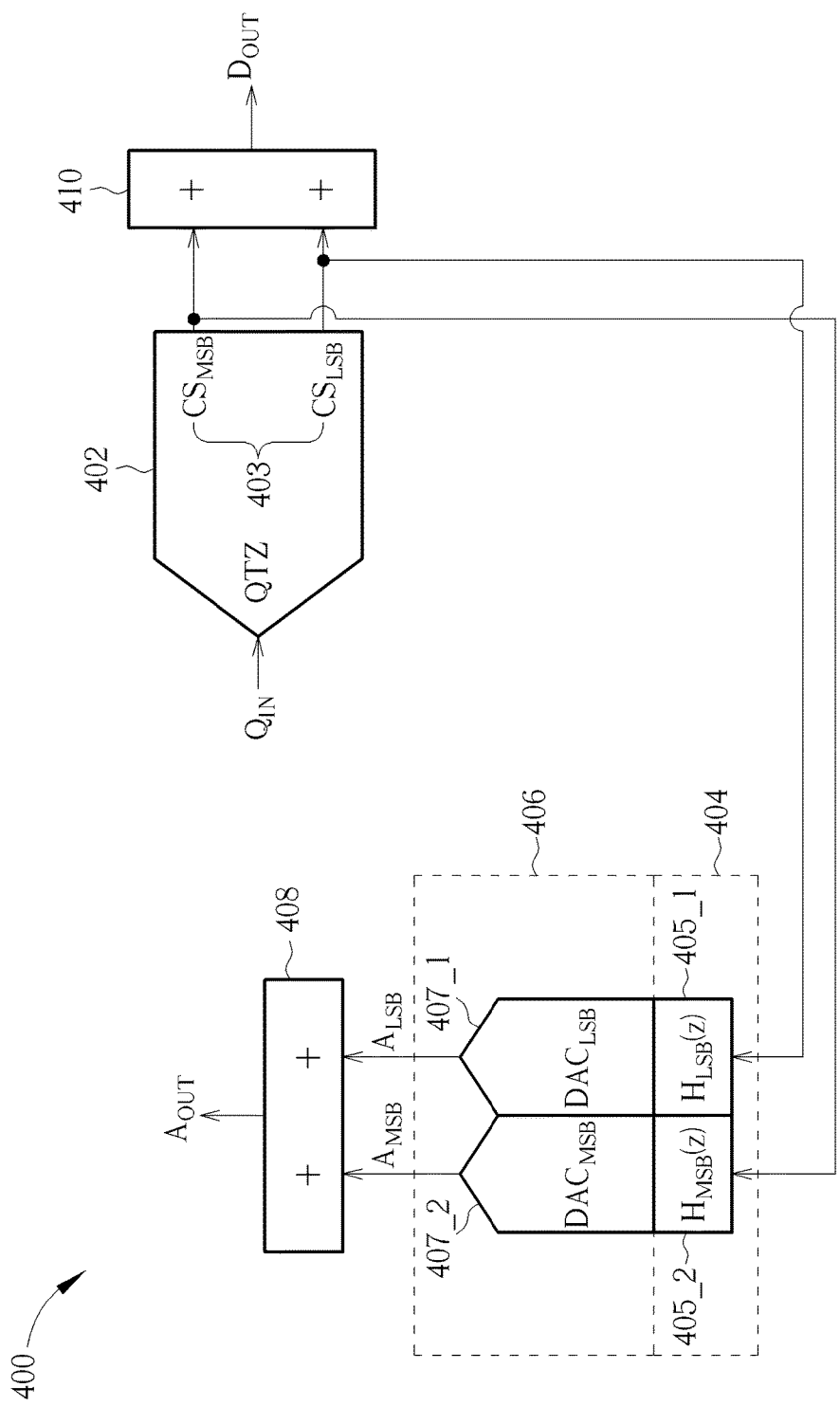
FIG. 4 is a diagram illustrating a second signal processing apparatus according to an embodiment of the present invention.

FIG. 4 is a diagram illustrating a second signal processing apparatus according to an embodiment of the present invention. The signal processing apparatus 400 is based on the circuit architecture shown in FIG. 1. The signal processing apparatus 400 includes a multi-bit quantizer 402, a processing circuit 404, a digital-to-analog conversion circuit 406, and a plurality of combining circuits 408 and 410. In this embodiment, the multi-bit output code 403 is partitioned into two code segments $CS_{MSB}$ and $CS_{LSB}$, wherein the code segment $CS_{MSB}$ consists of MSBs, and the code segment $CS_{LSB}$ consists of LSBs. For example, the multi-bit quantizer 402 is a 6-bit SAR-based quantizer which generates a 6-bit output code {b5, b4, b3, b2, b1, b0} representative of the analog input $Q_{IN}$ that may be a voltage level sampled in a current sampling clock period, the code segment $CS_{MSB}$ is a higher-order part {b5, b4, b3} of the 6-bit output code, and the code segment $CS_{LSB}$ is a lower-order part {b2, b1, b0} of the 6-bit output code. The multi-bit quantizer 402 resolves the code segments $CS_{MSB}$ and $CS_{LSB}$ one by one, and resolves bits in the same code segment $CS_{MSB}/CS_{LSB}$ one by one. The code segments $CS_{MSB}$ and $CS_{LSB}$ sequentially determined and output by the multi-bit quantizer 402 are combined at the combining circuit 410 and then concurrently output from the combining circuit 410, such that the complete multi-bit output code 403 (e.g., {b5, b4, b3, b2, b1, b0}) is output from the combining circuit 410 as the digital output $D_{OUT}$.

Since the multi-bit output code 403 is partitioned into two code segments $CS_{MSB}$ and $CS_{LSB}$, the processing circuit 404 has two digital signal processing circuits 405_1 and 405_2 with different transfer functions $H_{LSB}(z)$ and $H_{MSB}(z)$. In this embodiment, the digital signal processing circuits 405_1 and 405_2 are delay-based circuits each being a memory system whose output signal at any time depends on past value(s) of its input signal. Hence, none of the transfer functions $H_{LSB}(z)$ and $H_{MSB}(z)$ is a constant.

Since the multi-bit output code 403 is partitioned into two code segments $CS_{MSB}$ and $CS_{LSB}$, the digital-to-analog conversion circuit 406 includes two digital-to-analog converters (denoted by "$DAC_{LSB}$" and "$DAC_{MSB}$") 407_1 and 407_2. The combining circuit 408 generates and outputs an analog output $A_{OUT}$ by combining analog outputs $A_{LSB}$ and $A_{MSB}$ of digital-to-analog converters 407_1 and 407_2.

Figure 5:
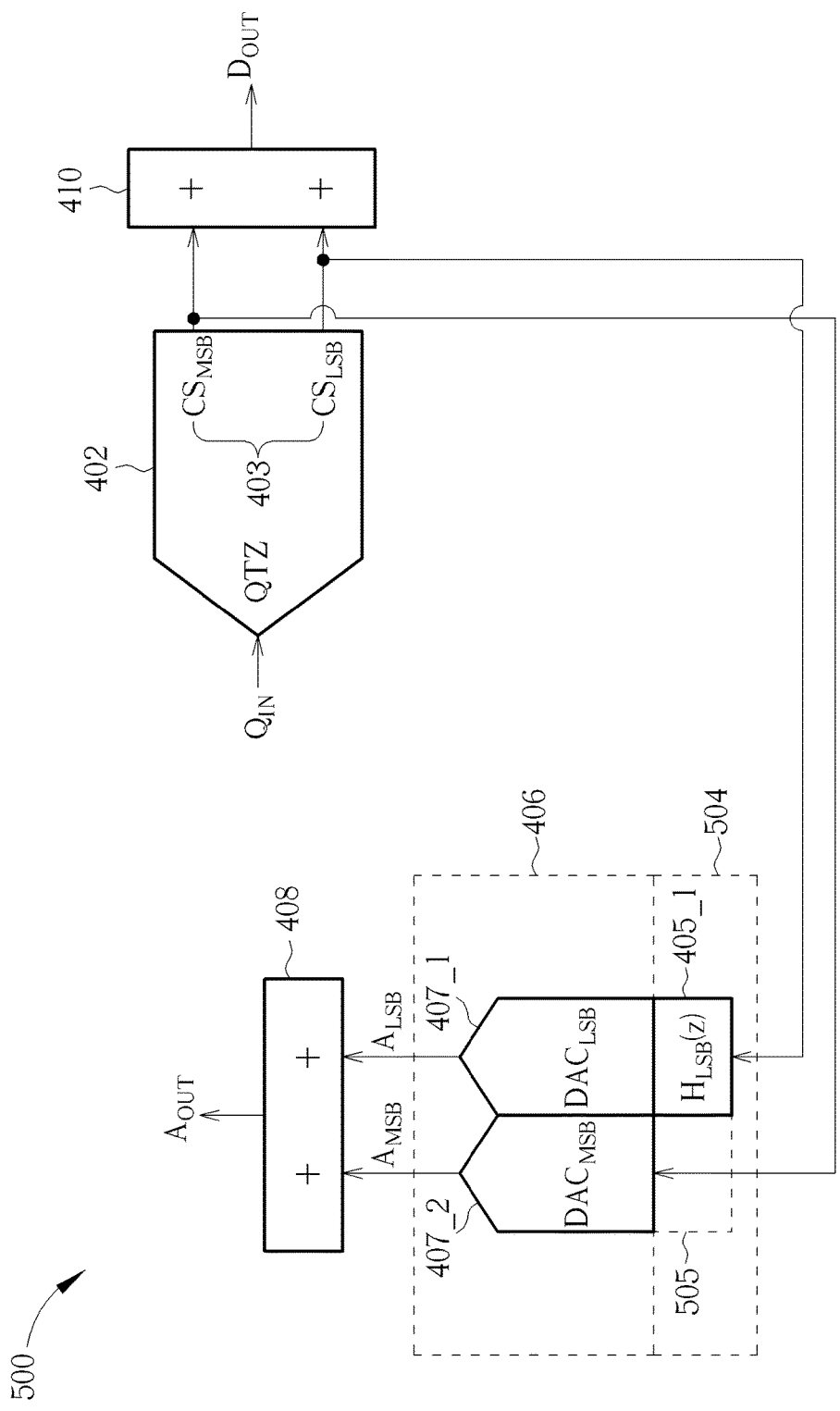
FIG. 5 is a diagram illustrating a third signal processing apparatus according to an embodiment of the present invention.

FIG. 5 is a diagram illustrating a third signal processing apparatus according to an embodiment of the present invention. The signal processing apparatus 500 is also based on the circuit architecture shown in FIG. 1. The major difference between the signal processing apparatuses 400 and 500 is that the processing circuit 504 includes a direct path 505 that is arranged to transmit the code segment $CS_{MSB}$ to the digital-to-analog converter 407_2 directly, such that the associated transfer function $H_{MSB}(z)$ is a constant (e.g., $H_{MSB}(z)=1$). In this embodiment, the code segment $CS_{MSB}$ output from the multi-bit quantizer 402 is directly fed into the digital-to-analog converter 407_2 without additional delay amount and/or additional weighting factor applied thereto, and the code segment $CS_{LSB}$ output from the multi-bit quantizer 402 is fed into the digital-to-analog converter 407_1 after being processed by additional delay amount and/or additional weighting factor.

The signal processing apparatus 100/400/500 may be employed by a variety of applications, including a delta-sigma modulator, an audio playback system, etc. Taking a delta-sigma modulator for example, the multi-bit quantizer 102/402 is an internal quantizer located at a feed-forward path, while the processing circuit 104/404/504, the digital-to-analog conversion circuit 106/406, and the combining circuit 108/408 are located at a feedback path. Further details of one delta-sigma modulator using the proposed signal processing apparatus 100/400/500 are described with reference to the accompanying drawings.

Figure 6:
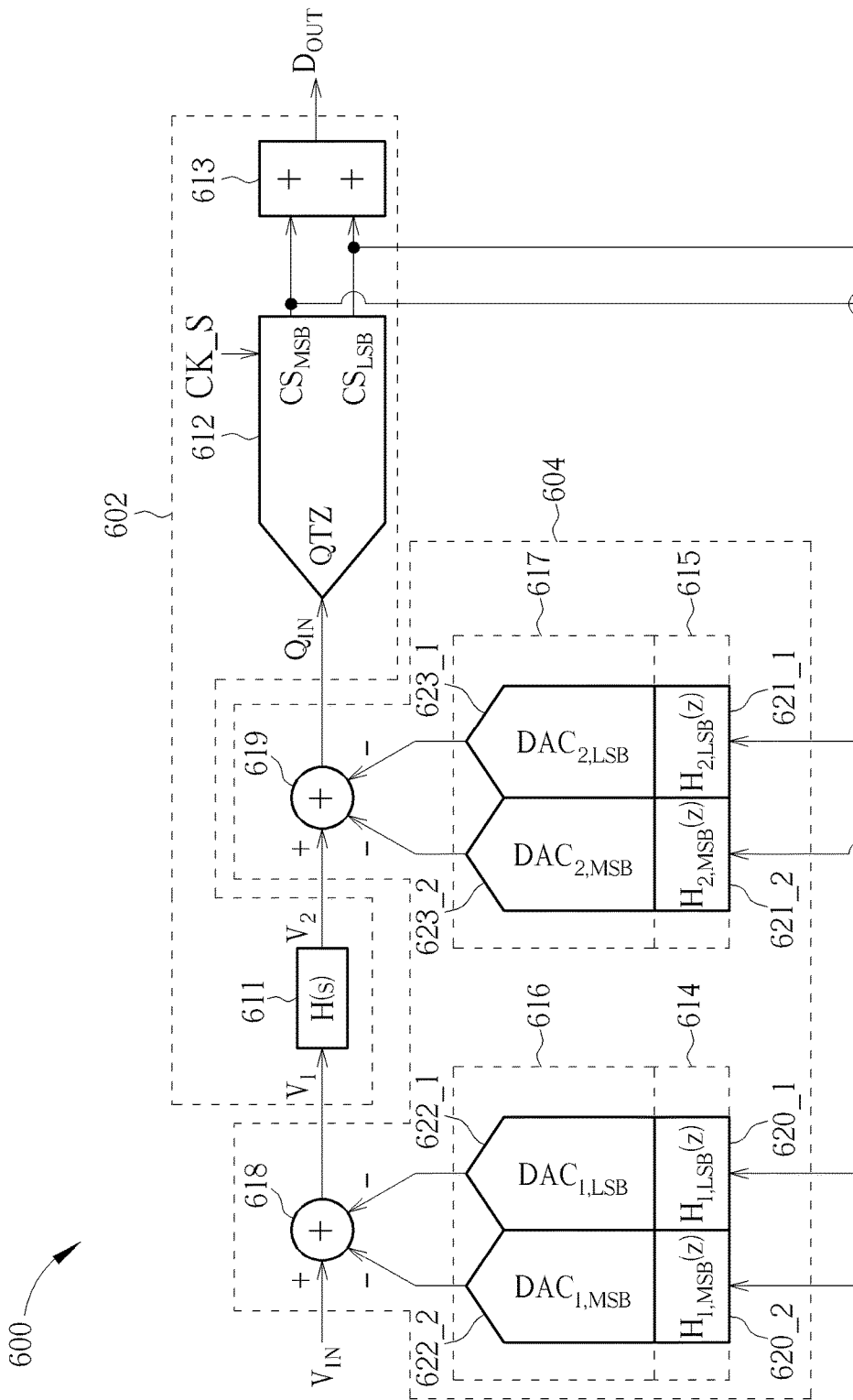
FIG. 6 is a diagram illustrating a first delta-sigma modulator using a proposed feedback design according to an embodiment of the present invention.

FIG. 6 is a diagram illustrating a first delta-sigma modulator using a proposed feedback design according to an embodiment of the present invention. The delta-sigma modulator 600 includes a feed-forward circuit 602 and a feedback circuit 604. The feed-forward circuit 602 includes an integrator circuit 611, a multi-bit quantizer (denoted by "QTZ") 612, and a combining circuit 613. In this embodiment, the integrator circuit 611 may be implementing using a first-order loop filter with a loop transfer function H(s); and the multi-bit quantizer 612 may be implemented using a SAR-based quantizer that operates in a sequential manner. For clarity and simplicity, it is assumed that a multi-bit output code of an analog input $Q_{IN}$ (e.g., a voltage level sampled in a current sampling clock period) is partitioned into two code segments, including one code segment $CS_{MSB}$ consisting of MSBs and another code segment $CS_{LSB}$ consisting of LSBs. The integrator circuit 611 is arranged to generate an analog output $V_2$ according to an analog input $V_1$ and the loop transfer function H(s). The multi-bit quantizer 612 is arranged to quantize the analog input $Q_{IN}$ to generate the multi-bit output code having two code segments $CS_{MSB}$ and $CS_{LSB}$ that are determined and output sequentially. The multi-bit quantizer 612 resolves the code segments $CS_{MSB}$ and $CS_{LSB}$ one by one, and resolves bits in the same code segment $CS_{MSB}/CS_{LSB}$ one by one. The combining circuit 613 is arranged to combine the code segments $CS_{MSB}$ and $CS_{LSB}$ sequentially provided from the preceding multi-bit quantizer 612, and output a digital output $D_{OUT}$ that contains the complete multi-bit output code ($CS_{MSB}$, $CS_{LSB}$) to a following processing circuit (not shown).

The feedback circuit 604 includes a plurality of processing circuits 614 and 615, a plurality of digital-to-analog conversion circuits 616 and 617, and a plurality of combining circuits 618 and 619. Since the multi-bit output code of the analog input $Q_{IN}$ is partitioned into two code segments $CS_{MSB}$ and $CS_{LSB}$, the processing circuit 614 includes two digital signal processing circuits 620_1 and 620_2 arranged to apply transfer functions $H_{1,LSB}(z)$ and $H_{1,MSB}(z)$ to the code segments $CS_{LSB}$ and $CS_{MSB}$, respectively; the processing circuit 615 includes two digital signal processing circuits 621_1 and 621_2 arranged to apply transfer functions $H_{2,LSB}(z)$ and $H_{2,MSB}(z)$ to the code segments $CS_{LSB}$ and $CS_{MSB}$, respectively; the digital-to-analog conversion circuit 616 includes two digital-to-analog converters (denoted by "$DAC_{1,LSB}$" and "$DAC_{1,MSB}$") 622_1 and 622_2 for converting digital outputs of digital signal processing circuits 620_1 and 620_2 into analog outputs; and the digital-to-analog conversion circuit 617 includes two digital-to-analog converters (denoted by "$DAC_{2,LSB}$" and "$DAC_{2,MSB}$") 623_1 and 623_2 for converting digital outputs of digital signal processing circuits 621_1 and 621_2 into analog outputs.

By way of example, but not limitation, the multi-bit quantizer 612 may be implemented by the aforementioned multi-bit quantizer 102/402, the processing circuit 614/615 may be implemented by the aforementioned processing circuit 104/404/504, the digital-to-analog conversion circuit 616/617 may be implemented by the aforementioned digital-to-analog conversion circuit 106/406, and the combining circuit 618/619 may be implemented by the aforementioned combining circuit 108/408.

The processing circuit 614 and the digital-to-analog conversion circuit 616 are located at an outer loop, such that analog outputs of the digital-to-analog converters 622_1 and 622_2 are combined at the combining circuit 618. Since the combining circuit 618 is placed at an input port of the integrator circuit 611, the combining circuit 618 updates the analog input $V_1$ by subtracting the analog outputs of the digital-to-analog converters 622_1 and 622_2 from an analog input $V_{IN}$ that may be an output of a sample and hold circuit (not shown) that operates according to a sampling clock CK_S with a sampling clock frequency Fs (or a sampling clock period Ts, where Ts=1/Fs). Specifically, the analog input $V_{IN}$ of the delta-sigma modulator 600 is combined with the analog outputs of the digital-to-analog converters 622_1 and 622_2 at the combining circuit 618.

The processing circuit 615 and the digital-to-analog conversion circuit 617 are located at an inner loop, such that analog outputs of the digital-to-analog converters 623_1 and 623_2 are combined at the combining circuit 619. Since the combining circuit 619 is placed between an input port of the multi-bit quantizer 612 and an output port of the integrator circuit 611, the combining circuit 619 updates the analog input $Q_{IN}$ by subtracting the analog outputs of the digital-to-analog converters 623_1 and 623_2 from the analog output $V_2$. Specifically, the analog output $V_2$ of the integrator circuit 611 is combined with the analog outputs of the digital-to-analog converters 623_1 and 623_2 at the combining circuit 619.

In a first exemplary delta-sigma modulator design, the digital-to-analog conversion circuit 617 and the processing circuit 615 located at the inner loop may be configured to employ the proposed feedback design that feeds back all of the code segments $CS_{MSB}$ and $CS_{LSB}$ (which are determined for the same analog input $Q_{IN}$ in a current sampling clock period) to the feed-forward path of the delta-sigma modulator 600, where the code segment $CS_{MSB}$ is fed back first to keep the system stability, and the code segment $CS_{LSB}$ is fed back later for achieving a better Signal-to-Quantization-Noise Ratio (SQNR) than a case that discards the code segment $CS_{LSB}$ directly. It should be noted that the transfer function $H_{2,MSB}(z)$ is different from the transfer function $H_{2,LSB}(z)$, and the transfer functions $H_{2,MSB}(z)$ and $H_{2,LSB}(z)$ are properly designed to provide a high-pass frequency response for noise shaping. Since the multi-bit quantizer 612 consumes more latency to resolve LSB information, the code segments $CS_{MSB}$ and $CS_{LSB}$ are determined and output by the multi-bit quantizer 612 sequentially. In this exemplary delta-sigma modulator design, the multi-bit quantizer 612 operates according to the same sampling clock CK_S used by the sample and hold circuit (not shown), and the code segments $CS_{MSB}$ and $CS_{LSB}$ are fed back in different sampling clock periods, where the code segment $CS_{MSB}$ is fed back earlier than the code segment $CS_{LSB}$. The quantization of the analog input $Q_{IN}$ (e.g., one sampled voltage level) for generating one multi-bit output code starts in a current sampling clock period, the code segment $CS_{MSB}$ indicative of MSB information of the analog input $Q_{IN}$ can be fully resolved by the multi-bit quantizer 612 in the current sampling clock period, and the code segment $CS_{LSB}$ indicative of LSB information of the analog input $Q_{IN}$ is not needed to be fed back to the feed-forward path in the current sampling clock period. For example, the code segment $CS_{MSB}$ is fed back in the current sampling clock period in which quantization of the analog input $Q_{IN}$ (e.g., one sampled voltage level) for generating one multi-bit output code starts, while the code segment $CS_{LSB}$ is fed back in a sampling clock period that is later than the current sampling clock period. In other words, a non-zero delay amount applied to the code segment $CS_{LSB}$ at the digital signal processing circuit 621_1 ensures that the code segment $CS_{LSB}$ is not needed to be supplied to the digital-to-analog converter 623_1 in the current sampling clock period.

The in-band truncation error contributed by the code segment $CS_{LSB}$ that is not fed back in the current sampling clock period is suppressed by the loop transfer function H(s) and is further suppressed by a transfer function intentionally added due to the transfer functions $H_{2,MSB}(z)$ and $H_{2,LSB}(z)$, where the additional transfer function is capable of shaping the truncation error to a high frequency band. Moreover, since a lower in-band noise floor can be achieved by suppressing the truncation error through the additional transfer function, the speed requirement in the inner loop would not be limited by the output rate of LSBs of the internal quantizer.

In one inner-loop feedback design, a difference between the transfer functions $H_{2,MSB}(z)$ and $H_{2,LSB}(z)$ includes at least one non-zero delay amount that is an integer multiple of the sampling clock period Ts. For example, $H_{2,MSB}(z)=1$, and $H_{2,LSB}(z)=2 \cdot z^{-1}-z^{-2}$. There is no non-zero delay amount applied by the transfer function $H_{2,MSB}(z)$, while each non-zero delay amount applied by the transfer function $H_{2,LSB}(z)$ ensures that the code segment $CS_{LSB}$ is not needed to be output in a current sampling clock period in which quantization of the analog input $Q_{IN}$ starts. For another example, $H_{2,MSB}(z)=z^{-1/2}$, and $H_{2,LSB}(z)=2 \cdot z^{-3/2}-z^{-5/2}$. The non-zero delay amount applied by the transfer function $H_{2,LSB}(z)$ ensures that the code segment $CS_{MSB}$ is still output in a current sampling clock period in which quantization of the analog input $Q_{IN}$ starts. In addition, each non-zero delay amount applied by the transfer function $H_{2,LSB}(z)$ ensures that the code segment $CS_{LSB}$ is not needed to be output in the current sampling clock period in which quantization of the analog input $Q_{IN}$ starts. When the timing difference between the MSB DAC path and the LSB DAC path is equal to 1*Ts, the associated noise transfer function (NTF) may be represented by $(1-z^{-1})^2$.

In another inner-loop feedback design, a difference between the transfer functions $H_{2,MSB}(z)$ and $H_{2,LSB}(z)$ includes at least one non-zero delay amount that is a non-integer multiple of the sampling clock period Ts. In this manner, the shaping ability can be enhanced due to higher equivalent operating speed, thus resulting in an improved SQNR. Specifically, the truncation error contributed by the code segment $CS_{LSB}$ not fed back in the current sampling clock period can be shaped to a higher frequency band due to higher equivalent operating speed of the implemented transfer function that is achieved by a fractional sampling clock period between the MSB DAC path and the LSB DAC path. For example, $H_{2,MSB}(z)=z^{-1/2}$, and $H_{2,LSB}(z)=2 \cdot z^{-1}-z^{-2}$. The non-zero delay amount applied by the transfer function $H_{2,LSB}(z)$ ensures that the code segment $CS_{MSB}$ is still output in a current sampling clock period in which quantization of the analog input $Q_{IN}$ starts. In addition, each non-zero delay amount applied by the transfer function $H_{2,LSB}(z)$ ensures that the code segment $CS_{LSB}$ is not needed to be output in the current sampling clock period in which quantization of the analog input $Q_{IN}$ starts. When the timing difference between the MSB DAC path and the LSB DAC path is equal to 0.5*Ts, the associated noise transfer function (NTF) may be represented by $(1-z^{-1/2})^2$ which provides better noise shaping ability.

In a second exemplary delta-sigma modulator design, the digital-to-analog conversion circuit 616 and the processing circuit 614 located at the outer loop may be configured to employ the proposed feedback design, where the transfer function $H_{1,MSB}(z)$ is different from the transfer function $H_{1,LSB}(z)$, and the transfer functions $H_{1,MSB}(z)$ and $H_{1,LSB}(z)$ are properly designed to offer a high-pass frequency response for noise shaping. As mentioned above, the code segments $CS_{MSB}$ and $CS_{LSB}$ are determined and output by the multi-bit quantizer 612 sequentially, and the multi-bit quantizer 612 operates according to the same sampling clock CK_S used by the sample and hold circuit (not shown). The code segment $CS_{MSB}$ is fed back to the feed-forward path earlier than the code segment $CS_{LSB}$. For example, $H_{1,MSB}(z)=z^{-1}$, and $H_{1,LSB}(z) \neq H_{1,MSB}(z)$. Thus, the code segment $CS_{MSB}$ obtained in a current sampling clock period is fed back to the modulator loop in a next sampling clock period due to $H_{1,MSB}(z)=z^{-1}$, and the code segments $CS_{MSB}$ and $CS_{LSB}$ are not concurrently fed back to the modulator loop due to $H_{1,LSB}(z) \neq H_{1,MSB}(z)$. In one outer-loop feedback design, a difference between the transfer functions $H_{1,MSB}(z)$ and $H_{1,LSB}(z)$ includes at least one non-zero delay amount that is an integer multiple of the sampling clock period Ts.

In another inner-loop feedback design, a difference between the transfer functions $H_{1,MSB}(z)$ and $H_{1,LSB}(z)$ includes at least one non-zero delay amount that is a non-integer multiple of the sampling clock period Ts.

In a third exemplary delta-sigma modulator design, the digital-to-analog conversion circuit 617 and the processing circuit 615 located at the inner loop may be configured to employ the proposed feedback design that feeds back the code segments $CS_{MSB}$ and $CS_{LSB}$ through different transfer functions $H_{2,MSB}(z)$ and $H_{2,LSB}(z)$ and the digital-to-analog conversion circuit 616 and the processing circuit 614 located at the outer loop may be configured to employ the proposed feedback design that feeds back the code segments $CS_{MSB}$ and $CS_{LSB}$ through different transfer functions $H_{1,MSB}(z)$ and $H_{1,LSB}(z)$.

In the delta-sigma modulator 600 shown in FIG. 6, the integrator circuit 611 is implemented using a first-order loop filter. However, the same feedback design proposed in the present invention can be applied to a delta-sigma modulator using a higher-order integrator circuit.

Figure 7:
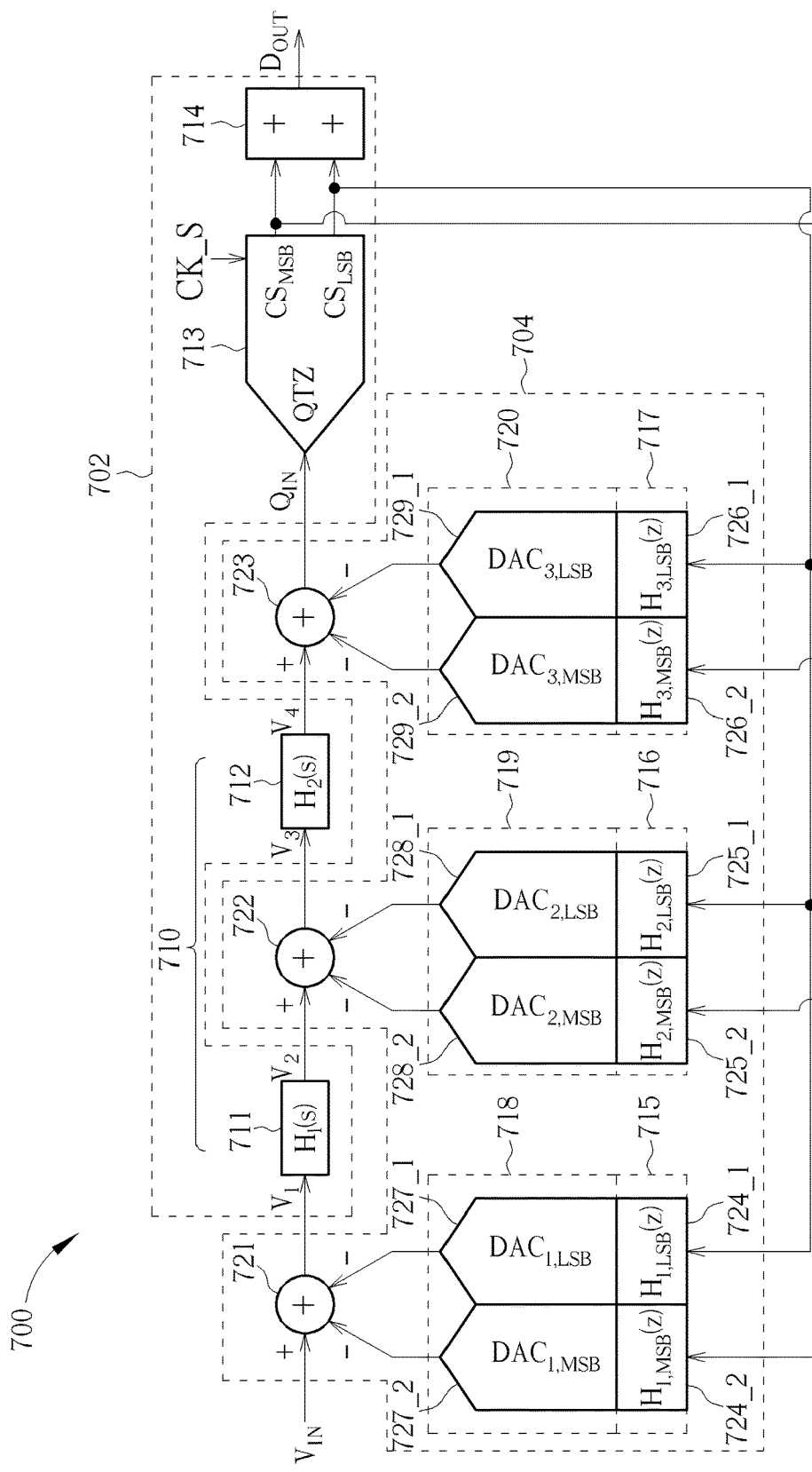
FIG. 7 is a diagram illustrating a second delta-sigma modulator using a proposed feedback design according to an embodiment of the present invention.

FIG. 7 is a diagram illustrating a second delta-sigma modulator using a proposed feedback design according to an embodiment of the present invention. The delta-sigma modulator 700 includes a feed-forward circuit 702 and a feedback circuit 704. The feed-forward circuit 702 includes an integrator circuit 710, a multi-bit quantizer (denoted by "QTZ") 713, and a combining circuit 714. In this embodiment, the integrator circuit 710 is an $N^{th}$-order integrator, where N>1. For example, the integrator circuit 710 includes two loop filters 711 and 712 that are cascaded, where the loop filter 711 is a $Q^{th}$-order filter with the transfer function $H_1(s)$, and the loop filter 712 is a $T^{th}$-order filter with the transfer function $H_2(s)$, where Q+T=N. For example, the integrator circuit 710 is a $3^{rd}$-order integrator circuit that includes the loop filter 711 being a $2^{nd}$-order filter and the loop filter 712 being a $1^{st}$-order filter. The loop filter 711 is arranged to generate an analog output $V_2$ according to an analog input $V_1$ and the loop transfer function $H_1(s)$. The loop filter 712 is arranged to generate an analog output $V_4$ according to an analog input $V_3$ and the transfer function $H_2(s)$. Since the truncation error nearby the internal quantizer would be suppressed by the preceding high-order loop filter, an order of the loop transfer function $H_1(s)$ is usually higher than an order of the loop transfer function $H_2(s)$.

The multi-bit quantizer 713 may be implemented using a SAR-based quantizer that operates in a sequential manner. The multi-bit quantizer 713 is arranged to quantize the analog input $Q_{IN}$ to generate the multi-bit output code. For clarity and simplicity, it is assumed that the multi-bit output code of the analog input $Q_{IN}$ is partitioned into two code segments, including one code segment $CS_{MSB}$ consisting of MSBs and another code segment $CS_{LSB}$ consisting of LSBs. The code segments $CS_{MSB}$ and $CS_{LSB}$ are determined and output sequentially. More specifically, the multi-bit quantizer 713 resolves the code segments $CS_{MSB}$ and $CS_{LSB}$ one by one, and resolves bits in the same code segment $CS_{MSB}/CS_{LSB}$ one by one.

In this exemplary delta-sigma modulator design, the multi-bit quantizer 713 operates according to a sampling clock CK_S with a sampling clock frequency Fs (or a sampling clock period Ts, where Ts=1/Fs). The quantization of the analog input $Q_{IN}$ starts in a current sampling clock period, the code segment $CS_{MSB}$ indicative of MSB information of the analog input $Q_{IN}$ is fully resolved by the multi-bit quantizer 713 in the current sampling clock period, and the code segment $CS_{LSB}$ indicative of LSB information of the analog input $Q_{IN}$ is not fed back to the feed-forward path in the current sampling clock period. For example, the code segment $CS_{MSB}$ is fed back in the current sampling clock period in which quantization of the analog input $Q_{IN}$ starts, while the code segment $CS_{LSB}$ is fed back in a sampling clock period that is later than the current sampling clock period.

The combining circuit 714 is arranged to combine the code segments $CS_{MSB}$ and $CS_{LSB}$ sequentially provided from the preceding multi-bit quantizer 613, and output a digital output $D_{OUT}$ containing the complete multi-bit output code ($CS_{MSB}$, $CS_{LSB}$) to a following processing circuit (not shown).

The feedback circuit 704 includes a plurality of processing circuits 715, 716, and 717, a plurality of digital-to-analog conversion circuits 718, 719, and 720, and a plurality of combining circuits 721, 722, and 723. Since the multi-bit output code of the analog input $Q_{IN}$ is partitioned into two code segments $CS_{MSB}$ and $CS_{LSB}$, the processing circuit 715 includes two digital signal processing circuits 724_1 and 724_2 arranged to apply transfer functions $H_{1,LSB}(z)$ and $H_{1,MSB}(z)$ to the code segments $CS_{LSB}$ and $CS_{MSB}$, respectively; the processing circuit 716 includes two digital signal processing circuits 725_1 and 725_2 arranged to apply transfer functions $H_{2,LSB}(z)$ and $H_{2,MSB}(z)$ to the code segments $CS_{LSB}$ and $CS_{MSB}$, respectively; the processing circuit 717 includes two digital signal processing circuits 726_1 and 726_2 arranged to apply transfer functions $H_{3,LSB}(z)$ and $H_{3,MSB}(z)$ to the code segments $CS_{LSB}$ and $C_{MSB}$, respectively; the digital-to-analog conversion circuit 618 includes two digital-to-analog converters (denoted by "$DAC_{1,LSB}$" and "$DAC_{1,MSB}$") 627_1 and 627_2 for converting digital outputs of digital signal processing circuits 724_1 and 724_2 into analog outputs; the digital-to-analog conversion circuit 719 includes two digital-to-analog converters (denoted by "$DAC_{2,LSB}$" and "$DAC_{2,MSB}$") 728_1 and 728_2 for converting digital outputs of digital signal processing circuits 725_1 and 725_2 into analog outputs; and the digital-to-analog conversion circuit 720 includes two digital-to-analog converters (denoted by "$DAC_{3,LSB}$" and "$DAC_{3,MSB}$") 729_1 and 729_2 for converting digital outputs of digital signal processing circuits 726_1 and 726_2 into analog outputs.

By way of example, but not limitation, the multi-bit quantizer 713 may be implemented by the aforementioned multi-bit quantizer 102/402, the processing circuit 715/716/717 may be implemented by the aforementioned processing circuit 104/404/504, the digital-to-analog conversion circuit 718/719/720 may be implemented by the aforementioned digital-to-analog conversion circuit 106/406, and the combining circuit 721/722/723 may be implemented by the aforementioned combining circuit 108/408.

The processing circuit 715 and the digital-to-analog conversion circuit 718 are located at an outer loop, such that analog outputs of the digital-to-analog converters 727_1 and 727_2 are combined at the combining circuit 721. Since the combining circuit 721 is placed at an input port of the integrator circuit 710 (particularly, an input port of the loop filter 711), the combining circuit 721 updates the analog input $V_1$ by subtracting the analog outputs of the digital-to-analog converters 727_1 and 727_2 from an analog input $V_{IN}$ which is an output of a sample and hold circuit (not shown) that operates according to the same sampling clock CK_S. Specifically, the analog input $V_{IN}$ of the delta-sigma modulator 700 is combined with the analog outputs of the digital-to-analog converters 727_1 and 727_2 at the combining circuit 721.

The processing circuit 716 and the digital-to-analog conversion circuit 719 are located at one inner loop, such that analog outputs of the digital-to-analog converters 728_1 and 728_2 are combined at the combining circuit 722. Since the combining circuit 722 is placed between an input port of the loop filter 712 and an output port of the loop filter 712, the combining circuit 722 updates the analog input $V_3$ by subtracting the analog outputs of the digital-to-analog converters 728_1 and 728_2 from the analog output $V_2$. Specifically, the analog output $V_2$ of the loop filter 711 is combined with the analog outputs of the digital-to-analog converters 728_1 and 728_2 at the combining circuit 722.

The processing circuit 717 and the digital-to-analog conversion circuit 720 are located at one inner loop that is closest to the multi-bit quantizer 713, such that analog outputs of the digital-to-analog converters 729_1 and 729_2 are combined at the combining circuit 723. Since the combining circuit 723 is placed at an input port of the multi-bit quantizer 713 (or an output port of the integrator circuit 710), the combining circuit 723 updates the analog input $Q_{IN}$ by subtracting the analog outputs of the digital-to-analog converters 729_1 and 729_2 from the analog output $V_4$. Specifically, the analog output $V_4$ of the loop filter 712 is combined with the analog outputs of the digital-to-analog converters 729_1 and 729_2 at the combining circuit 723.

In a first exemplary delta-sigma modulator design, the digital-to-analog conversion circuit 720 and the processing circuit 717 located at one inner loop may be configured to employ the proposed feedback design, where the transfer function $H_{3,MSB}(z)$ is different from the transfer function $H_{3,LSB}(z)$, and the transfer functions $H_{3,MSB}(z)$ and $H_{3,LSB}(z)$ are properly designed to offer a high-pass frequency response for noise shaping. Since the multi-bit quantizer 713 consumes more latency to resolve LSB information, the code segments $CS_{MSB}$ and $CS_{LSB}$ are determined and output by the multi-bit quantizer 713 sequentially. In this exemplary delta-sigma modulator design, the multi-bit quantizer 713 operates according to the sampling clock CK_S, and the code segment $CS_{MSB}$ is fed back to the feed-forward path earlier than the code segment $CS_{LSB}$.

In one inner-loop feedback design, a difference between the transfer functions $H_{3,MSB}(z)$ and $H_{3,LSB}(z)$ includes at least one non-zero delay amount that is an integer multiple of the sampling clock period Ts. For example, $H_{3,MSB}(z)=1$, and $H_{3,LSB}(z)=2 \cdot z^{-1} - z^{-2}$. There is no non-zero delay amount applied by the transfer function $H_{2,MSB}(z)$ while each non-zero delay amount applied by the transfer function $H_{2,LSB}(z)$ ensures that the code segment $CS_{LSB}$ is not needed to be output in a current sampling clock period in which quantization of the analog input $Q_{IN}$ starts. For another example, $H_{3,MSB}(z)=z^{-1/2}$, and $H_{3,LS}(z)=2 \cdot z^{-3/2} - z^{-5/2}$. The non-zero delay amount applied by the transfer function $H_{2,LSB}(z)$ ensures that the code segment $CS_{MSB}$ is still output in a current sampling clock period in which quantization of the analog input $Q_{IN}$ starts. In addition, each non-zero delay amount applied by the transfer function $H_{2,LSB}(z)$ ensures that the code segment $CS_{LSB}$ is not needed to be output in the current sampling clock period in which quantization of the analog input $Q_{IN}$ starts. When the timing difference between the MSB DAC path and the LSB DAC path is equal to 1*Ts, the associated noise transfer function (NTF) may be represented by $(1-z^{-1})^2$.

In another inner-loop feedback design, a difference between the transfer functions $H_{3,MSB}(z)$ and $H_{3,LSB}(z)$ includes at least one non-zero delay amount that is a non-integer multiple of the sampling clock period Ts. In this manner, the shaping ability can be enhanced due to higher equivalent operating speed, thus resulting in an improved SQNR. Specifically, the truncation error contributed by the code segment $CS_{LSB}$ not fed back in the current sampling clock period can be shaped to the higher frequency band due to higher equivalent operating speed of the implemented transfer function that is achieved by using a fractional sampling clock period between the MSB feedback path and the LSB feedback path. For example, $H_{3,MSB}(z)=z^{-1/2}$, and $H_{3,LSB}(z)=2 \cdot z^{-1} - z^{-2}$. The non-zero delay amount applied by the transfer function $H_{2,LSB}(z)$ ensures that the code segment $CS_{MSB}$ is still output in a current sampling clock period in which quantization of the analog input $Q_{IN}$ starts. In addition, each non-zero delay amount applied by the transfer function $H_{2,LSB}(z)$ ensures that the code segment $CS_{LSB}$ is not needed to be output in the current sampling clock period in which quantization of the analog input $Q_{IN}$ starts. When the timing difference between the MSB DAC path and the LSB DAC path is equal to 0.5*Ts, the associated noise transfer function (NTF) may be represented by $(1-z^{-1/2})^2$.

In a second exemplary delta-sigma modulator design, the digital-to-analog conversion circuit 719 and the processing circuit 716 located at another inner loop may be configured to employ the proposed feedback design, where the transfer function $H_{2,MSB}(z)$ is different from the transfer function $H_{2,LSB}(z)$, and the transfer functions $H_{2,MSB}(z)$ and $H_{2,LSB}(z)$ are properly designed to offer a high-pass frequency response for noise shaping. As mentioned above, the multi-bit quantizer 713 operates according to the sampling clock CK_S, and the code segment $CS_{MSB}$ is fed back to the feed-forward path earlier than the code segment $CS_{LSB}$. For example, $H_{2,MSB}(z)=z^{-1}$ (or $z^{-1/2}$), and $H_{2,LSB}(z) \neq z^{-1}$ (or $z^{-1/2}$). Thus, the code segment $CS_{MSB}$ obtained in a current sampling clock period is fed back to the feed-forward path in a next sampling clock period (or the current sampling clock period) due to $H_{2,MSB}(z)=z^{-1}$ (or $z^{-1/2}$), and the code segments $CS_{MSB}$ and $CS_{LSB}$ are not concurrently fed back to the feed-forward path due to $H_{2,LSB}(z) \neq H_{2,MSB}(z)$. In one inner-loop feedback design, a difference between the transfer functions $H_{2,MSB}(z)$ and $H_{2,LSB}(z)$ includes at least one non-zero delay amount that is an integer multiple of the sampling clock period Ts. In another inner-loop feedback design, a difference between the transfer functions $H_{2,MSB}(z)$ and $H_{2,LSB}(z)$ includes at least one non-zero delay amount that is a non-integer multiple of the sampling clock period Ts.

In a third exemplary delta-sigma modulator design, the digital-to-analog conversion circuit 718 and the processing circuit 715 located at the outer loop may be configured to employ the proposed feedback design, where the transfer function $H_{1,MSB}(z)$ is different from the transfer function $H_{1,LSB}(z)$, and the transfer functions $H_{1,MSB}(z)$ and $H_{1,LSB}(z)$ are properly designed to offer a high-pass frequency response for noise shaping. As mentioned above, the multi-bit quantizer 713 operates according to the sampling clock CK_S, and the code segment $CS_{MSB}$ is fed back to the feed-forward path earlier than the code segment $CS_{LSB}$. For example, $H_{1,MSB}(z)=z^{-1}$, and $H_{1,LSB}(z) \neq z^{-1}$. Thus, the code segment $CS_{MSB}$ obtained in a current sampling clock period is fed back to the feed-forward path in a next sampling clock period due to $H_{1,MSB}(z)=z^{-1}$, and the code segments $CS_{MSB}$ and $CS_{LSB}$ are not concurrently fed back to the feed-forward path due to $H_{1,LSB}(z) \neq H_{1,MSB}(z)$. In one outer-loop feedback design, a difference between the transfer functions $H_{1,MSB}(z)$ and $H_{1,LSB}(z)$ includes at least one non-zero delay amount that is an integer multiple of the sampling clock period Ts. In another outer-loop feedback design, a difference between the transfer functions $H_{1,MSB}(z)$ and $H_{1,LSB}(z)$ includes at least one non-zero delay amount that is a non-integer multiple of the sampling clock period Ts.

In a fourth exemplary delta-sigma modulator design, two or all of the feedback paths, including the digital-to-analog conversion circuit 720 and the processing circuit 717 located at one inner loop, the digital-to-analog conversion circuit 719 and the processing circuit 716 located at another inner loop, and the digital-to-analog conversion circuit 718 and the processing circuit 715 located at the outer loop, may be configured to employ the proposed feedback design that feeds back the code segments $CS_{MSB}$ and $CS_{LSB}$ through different transfer functions. For example, $H_{1,MSB}(z) \neq H_{1,LSB}(z)$, $H_{2,MSB}(z) \neq H_{2,LSB}(z)$, and/or $H_{3,MSB}(z) \neq H_{3,LSB}(z)$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing apparatus comprising:
   a multi-bit quantizer, arranged to quantize an analog input to generate a multi-bit output code, wherein the multi-bit output code comprises a plurality of code segments, the code segments comprise a first code segment and a second code segment, wherein the multi-bit quantizer completes determination of the second code segment before completing determination of the first code segment; and
   a processing circuit, arranged to receive the code segments from the multi-bit quantizer, and further arranged to generate a plurality of digital outputs according to the code segments, respectively, wherein the digital outputs comprise a first digital output derived from the first code segment and a second digital output derived from the second code segment, wherein the processing circuit receives the second code segment from the multi-bit quantizer before receiving the first code segment from the multi-bit quantizer, and a first transfer function between the first digital output and the first code segment is different from a second transfer function between the second digital output and the second code segment.

2. The signal processing apparatus of claim 1, further comprising:
   a digital-to-analog conversion circuit, arranged to receive the digital outputs from the processing circuit, and convert the digital outputs into first analog outputs, respectively; and
   a combining circuit, arranged to generate and output a second analog output by combining the first analog outputs of the digital-to-analog conversion circuit.

3. The signal processing apparatus of claim 1, wherein the multi-bit quantizer operates according to a sampling clock with a sampling clock period, and a difference between the first transfer function and the second transfer function comprises at least one non-zero delay amount that is an integer multiple of the sampling clock period.

4. The signal processing apparatus of claim 1, wherein the multi-bit quantizer operates according to a sampling clock with a sampling clock period, and a difference between the first transfer function and the second transfer function comprises at least one non-zero delay amount that is a non-integer multiple of the sampling clock period.

5. The signal processing apparatus of claim 1, wherein the processing circuit comprises:
   a first delay-based circuit, arranged to receive the first code segment, and output the first digital output according to the first code segment, wherein the first delay-based circuit comprises:
      a first delay circuit, arranged to apply a first non-zero delay amount to the first code segment.

6. The signal processing apparatus of claim 5, wherein the multi-bit quantizer operates according to a sampling clock with a sampling clock period, and the first non-zero delay amount ensures that the first code segment is not needed to be output in a current sampling clock period in which quantization of the analog input for generating the multi-bit output code starts.

7. The signal processing apparatus of claim 5, wherein the first delay-based circuit further comprises a multiplier circuit arranged to apply a weighting factor to the first code segment.

8. The signal processing apparatus of claim 5, wherein the processing circuit further comprises:
   a direct path, arranged to transmit the second code segment as the second digital output directly.

9. The signal processing apparatus of claim 5, wherein the processing circuit further comprises:
   a second delay-based circuit, arranged to receive the second code segment, and output the second digital output according to the second code segment, wherein the second delay-based circuit comprises:
      a second delay circuit, arranged to apply a second non-zero delay amount to the second code segment, wherein the second non-zero delay amount is different from the first non-zero delay amount.

10. The signal processing apparatus of claim 9, wherein the multi-bit quantizer operates according to a sampling clock with a sampling clock period, and the second non-zero delay amount ensures that the second code segment is still output in a current sampling clock period in which quantization of the analog input for generating the multi-bit output code starts.

11. The signal processing apparatus of claim 10, wherein the first non-zero delay amount ensures that the first code segment is not needed to be output in the current sampling clock period in which quantization of the analog input for generating the multi-bit output code starts.

12. A delta-sigma modulator comprising:
    a feed-forward circuit, comprising:
       an integrator circuit, arranged to generate a first analog output according to a first analog input; and
       a multi-bit quantizer, arranged to quantize a second analog input to generate a multi-bit output code, wherein the second analog input is derived from the first analog output, and the multi-bit output code comprises a plurality of code segments sequentially determined by the multi-bit quantizer; and
    a feedback circuit, comprising:
       a processing circuit, arranged to receive the code segments from the multi-bit quantizer sequentially, and further arranged to generate a plurality of digital outputs according to the code segments, respectively;
       a digital-to-analog conversion circuit, arranged to receive the digital outputs from the processing circuit, and convert the digital outputs into second analog outputs, respectively; and
       a combining circuit, arranged to generate and output a third analog output to the feed-forward circuit by combining the second analog outputs of the digital-to-analog conversion circuit;

wherein the code segments comprise a first code segment and a second code segment, the digital outputs comprise a first digital output derived from the first code segment and a second digital output derived from the second code segment, and a first transfer function between the first digital output and the first code segment is different from a second transfer function between the second digital output and the second code segment.

13. The delta-sigma modulator of claim 12, wherein the combining circuit is further arranged to update the second analog input by combining the first analog output and the third analog output.

14. The delta-sigma modulator of claim 12, wherein the integrator circuit comprises a plurality of loop filters that are cascaded, the loop filters comprise a first loop filter followed by a second loop filter, and the combining circuit is further arranged to generate an analog input of the second loop filter by combining an analog output of the first loop filter and the third analog output.

15. The delta-sigma modulator of claim 12, wherein the combining circuit is further arranged to generate the first analog input by combining a third analog input and the third analog output.

16. The delta-sigma modulator of claim 12, wherein the multi-bit quantizer operates according to a sampling clock with a sampling clock period, and a difference between the first transfer function and the second transfer function comprises at least one non-zero delay amount that is an integer multiple of the sampling clock period.

17. The delta-sigma modulator of claim 12, wherein the multi-bit quantizer operates according to a sampling clock with a sampling clock period, and a difference between the first transfer function and the second transfer function comprises at least one non-zero delay amount that is a non-integer multiple of the sampling clock period.

18. The delta-sigma modulator of claim 12, wherein the processing circuit comprises:

a delay-based circuit, arranged to receive the first code segment, and output the first digital output according to the first code segment, wherein the delay-based circuit comprises:

a delay circuit, arranged to apply a non-zero delay amount to the first code segment.

19. The delta-sigma modulator of claim 18, wherein the multi-bit quantizer operates according to a sampling clock with a sampling clock period, and the non-zero delay amount ensures that the first code segment is not needed to be output to the digital-to-analog conversion circuit in a current sampling clock period in which quantization of the second analog input for generating the multi-bit output code starts.

20. The delta-sigma modulator of claim 18, wherein the delay-based circuit further comprises a multiplier circuit arranged to apply a weighting factor to the first code segment.

* * * * *